United States Patent [19]

Sivan et al.

[11] Patent Number: 5,061,646

[45] Date of Patent: Oct. 29, 1991

[54] METHOD FOR FORMING A SELF-ALIGNED BIPOLAR TRANSISTOR

[75] Inventors: Richard D. Sivan; James D. Hayden, both of Austin, Tex.

[73] Assignee: Motorola, Inc., Schaumburg, Ill.

[21] Appl. No.: 631,174

[22] Filed: Dec. 19, 1990

Related U.S. Application Data

[62] Division of Ser. No. 546,640, Jun. 29, 1990, abandoned.

[51] Int. Cl.$^5$ .......................................... H01L 21/265
[52] U.S. Cl. ......................................... 437/31; 437/33; 437/162; 437/909; 437/984; 148/DIG. 11; 148/DIG. 124
[58] Field of Search ....................... 357/34, 43, 54, 71; 437/31, 33, 162, 78, 909, 984; 148/DIG. 10, DIG. 11, DIG. 124

[56] References Cited

U.S. PATENT DOCUMENTS

| | | | |
|---|---|---|---|
| 4,546,536 | 10/1985 | Anantha et al. | 437/33 |
| 4,707,456 | 11/1987 | Thomas | 357/43 |
| 4,710,241 | 12/1987 | Komatsu | 357/54 |
| 4,749,661 | 6/1988 | Bower | 357/54 |
| 4,855,801 | 8/1989 | Kuesters | 357/54 |
| 4,966,865 | 10/1990 | Welch et al. | 437/31 |

OTHER PUBLICATIONS

"An Advanced PSA Technology for High-Speed Bipolar LSI", H. Nakashiba et al., IEEE Transactions on Electron Devices, vol. ED27, No. 8, p. 1390, 1980.
"Submicron BiCMOS Well Design For Optimum Circuit Performance", R. A. Chapman et al., IEEE-IEDM Tech. Digest, p. 756, 1988.

Primary Examiner—Brian E. Hearn
Assistant Examiner—Tuan Nguyen
Attorney, Agent, or Firm—Jasper W. Dockrey

[57] ABSTRACT

A structure and process for fabricating a fully self-aligned high-performance bipolar semiconductor device is disclosed. In accordance with one embodiment of the invention, a substrate is provided having a first surface. A heavily doped buried layer is formed in the substrate extending from the first surface and a lightly doped epitaxial layer overlies the first surface. An isolation region is formed in the epitaxial layer dividing the epitaxial layer into an active surface region and an isolation region. A base electrode is formed on a first portion of the active surface region having an opening which exposes a second portion of the active surface region. An emitter electrode, which is self-aligned to the base electrode, overlies a portion of the base electrode and extends through the opening in the base electrode making contact with the second portion of the active surface region. A collector plug is self-aligned to the active surface region at the edge of the base electrode and extends into the epitaxial layer making contact with the buried layer.

9 Claims, 6 Drawing Sheets

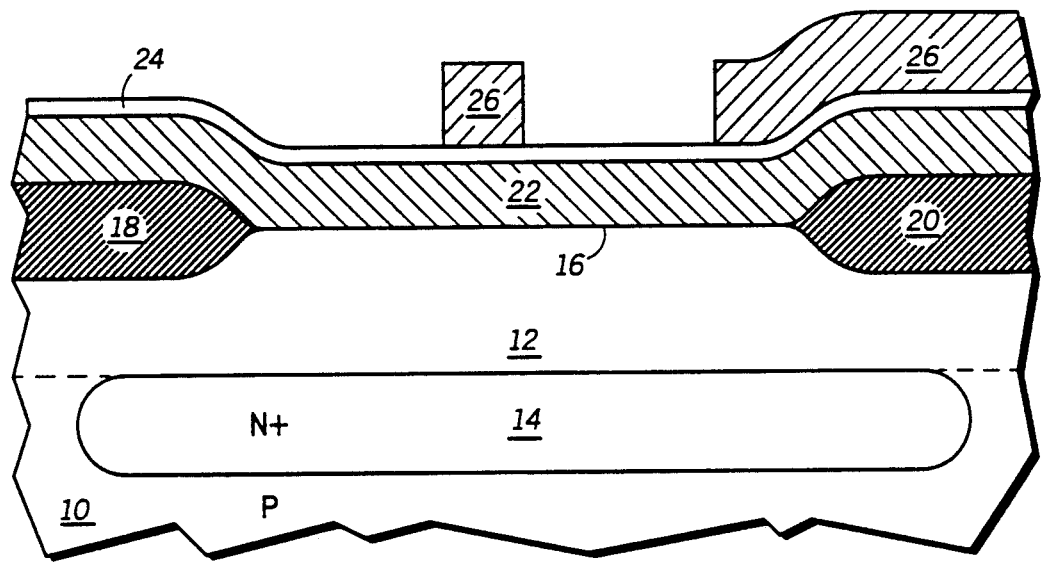
*FIG.1*
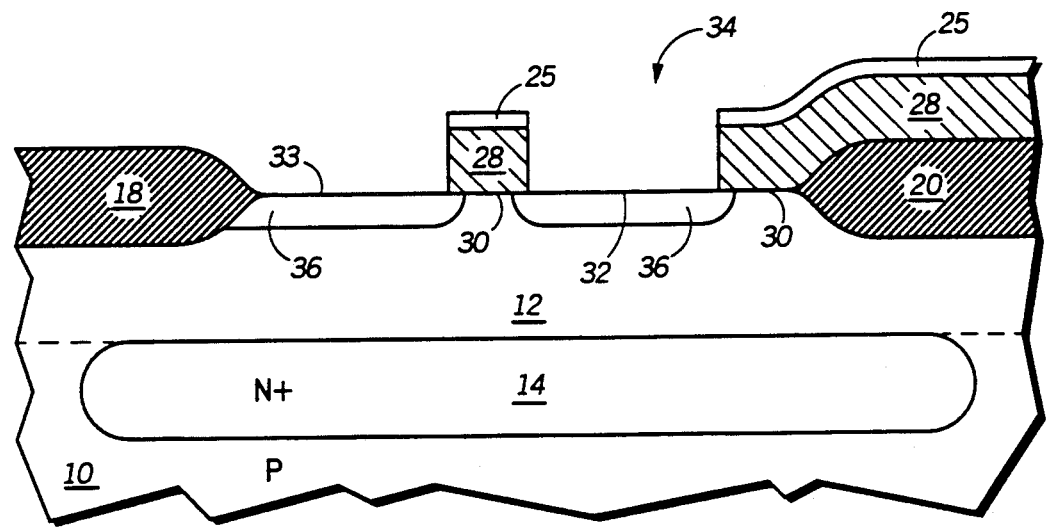
*FIG.2-a*

FIG.2-b

METHOD FOR FORMING A SELF-ALIGNED BIPOLAR TRANSISTOR

This application is a division of prior application Ser. No. 546,640, filed June 29, 1990 now abandoned.

BACKGROUND OF THE INVENTION

This invention relates in general to semiconductor devices and to a method for fabricating those devices, and more particularly to bipolar transistors having improved switching performance and whose fabrication is concomitant with existing MOS process methods.

Vertical bipolar switching transistors are commonly used in integrated circuits for data storage and logic flow control. In high speed devices, both the electrical resistance and the parasitic capacitance in the transistor must be minimized so that the transistor can switch on and off rapidly. In addition, bipolar transistors used in advanced VLSI BiCMOS devices must meet further performance criteria and design constraints which are related to the signal transmission requirements of the associated MOS transistors. For example, high speed bipolar switching transistors used in BiCMOS circuits must be designed to have minimal signal propagation delay. The most direct method for boosting the signal transmission rate and increasing the switching speed is to reduce the electrical resistance and the capacitance within the transistor.

The electrical resistance can be reduced by fabricating the bipolar transistor in a thin epitaxial layer grown on a single crystal semiconductor substrate. The thin epitaxial layer reduces the current path length between the emitter and the collector; however, the electrical resistance in the collector itself represents a major component of the overall electrical resistance in the bipolar transistor. A low resistance collector contact structure is usually fabricated by performing a heavy implant into a selected portion of the epitaxial layer, then diffusing the dopant atoms through the epitaxial layer to a heavily doped buried layer located in the single crystal substrate. Collector resistance has a dominant effect on signal propagation delay of a bipolar transistor under heavy capacitive loading. For BiCMOS applications, NPN transistors have collector current densities on the order of 400 to 800 microamps per square micrometer. The formation of a low resistance collector presents a problem unique to BiCMOS devices in that the dopant diffusion process used to form the collector in a conventional bipolar transistor causes unwanted lateral diffusion of dopants in the associated MOS transistors found in a BiCMOS device. One solution to the lateral diffusion problem is to form a collector plug by etching a trench through the epitaxial layer to expose a portion of the buried collector, then filling the trench with doped polysilicon. The collector plug forms a low resistance contact to the buried collector while avoiding the problem of subjecting the MOS devices to a long thermal cycle. To further reduce the collector resistance, the current path between the base-collector junction and the collector electrode contact at the surface of the epitaxial layer should be a short as possible. Again, one possibility is to make the epitaxial layer very thin thereby reducing the length of the collector plug. However, the minimum epitaxial layer thickness is set by the collector-emitter breakdown voltage and the collector capacitance. For example, for a minimum collector-emitter breakdown voltage of 7 V an epitaxial layer thickness of about 1.25 micrometers is required. Furthermore, continued thinning of the epitaxial layer is undesirable because the out-diffusion of dopants from the heavily doped buried layer into the thin epitaxial layer increases the collector capacitance. As the epitaxial layer becomes very thin, the out-diffusion of buried layer dopants raises the dopant concentration in the epitaxial layer to unacceptably high levels and parasitic capacitance slows the switching speed.

In view of the limitation to a further reduction in the thickness of the epitaxial layer, one method for partially decreasing the current path length in the transistor is to reduce the lateral separation distance between the emitter, the base. This approach has the added benefit of permitting more transistors to be placed in a smaller surface area on a chip thereby increasing the packing density and enabling higher integration levels in VLSI circuits. The lateral separation between the emitter electrode and the base electrode is reduced by providing an opening in the base electrode overlying the active region. The emitter electrode is then formed over a portion of the base electrode and makes an emitter contact to the active region through the opening in the base electrode. An intermediate isolation layer is used to insure that the emitter electrode remains electrically isolated from the base electrode. Transistor designs of this type have been described by, for example, H. Nakashiba et al., IEEE Trans. Elect. Dev. ED-27 (8), p. 1390, 1980 and R. A. Chapman et al. IEEE IEDM, p 756, 1988. This structure provides a narrow emitter width and a low base resistance, however, the collector separation distance is not considered in this design.

While some benefit is obtained from a reduction in the emitter-base lateral separation distance, the structures of the prior art do not solve the most critical problem of total electrical path length and in particular the problem of excessive separation of the collector contact structure from the emitter-base junction. Therefore, it would be desirable to fabricate a bipolar transistor, in a manner compatible with an MOS process sequence, which maintains the advantage of a heavily doped collector plug while minimizing the lateral separation of the collector, base and emitter electrodes.

BRIEF SUMMARY OF THE INVENTION

In practicing the present invention there is provided a structure and process for fabricating a fully self-aligned high-performance bipolar semiconductor device. In the vertical bipolar device, improved switching speed is obtained because the collector plug and the emitter are both self-aligned to the base electrode. A sidewall spacer is formed on the base electrode to separate and electrically isolate the collector plug and the emitter from the base electrode. The self-alignment of the collector plug and the emitter to the base reduces the lateral separation of the collector and emitter from the base electrode. The reduction in lateral separation of the transistor electrodes minimizes both the collector resistance and the parasitic capacitance thereby increasing the switching speed of the device. Additionally, the self-alignment of the emitter and the collector plug to the base electrode reduces the overall substrate surface area needed to fabricate the various components of the transistor enabling an increase in transistor density and high levels of integration.

The fabrication sequence used to form the bipolar transistor of the present invention is fully compatible with a conventional MOS fabrication process enabling the bipolar transistor to be fabricated in a BiCMOS integrated circuit as well as a bipolar integrated circuit such as an ECL or TTL circuit. In accordance with one embodiment of the invention, a substrate is provided having a first surface. A heavily doped buried layer is formed in the substrate extending from the first surface and a lightly doped epitaxial layer overlies the first surface. An isolation region is formed in the epitaxial layer dividing the epitaxial layer into an active surface region and an isolation region. A base electrode is formed on a first portion of the active surface region having an opening which exposes a second portion of the active surface region. An emitter electrode, which is self-aligned to the base electrode, overlies a portion of the base electrode and extends through the opening in the base electrode making contact with the second portion of the active surface region. A collector plug is self-aligned to the active surface region at the edge of the base electrode and the isolation region and extends into the epitaxial layer making contact with the buried layer.

BRIEF DESCRIPTION OF THE DRAWINGS

FIG. 1 illustrates, in cross section, a portion of a semiconductor substrate having an overlying patterned conductive layer;

FIG. 2-b, is a cabinet view of the structure shown in FIG. 2-a;

Figure 2:
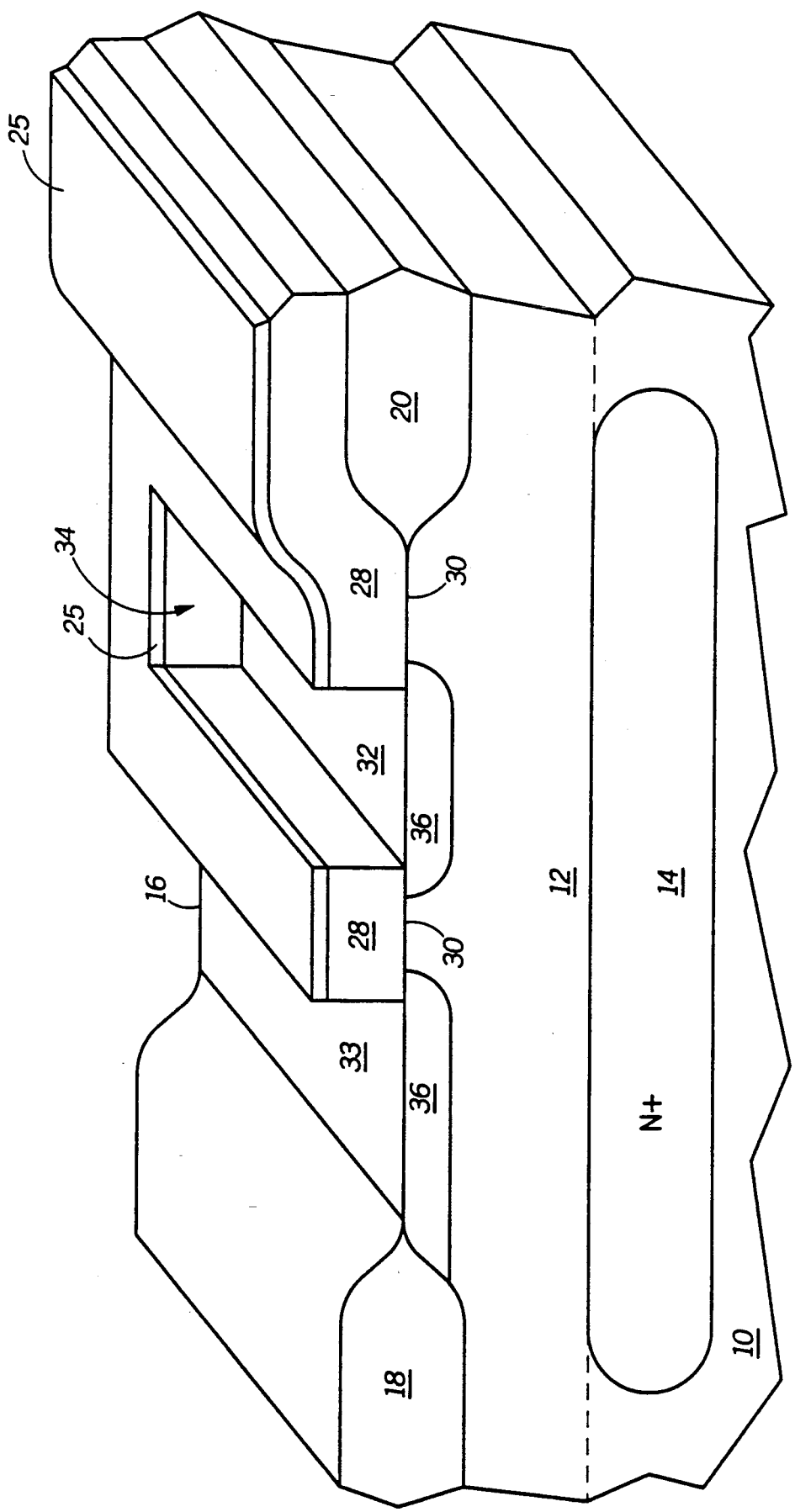
FIG. 2-a, illustrates, in cross section, the formation of an insulated base electrode overlying an active surface region of the substrate.

It will be apprciated that in FIGURES the proportions of the various elements are not to scale. For example, the dimensions of some of the elements are exaggerated relative to each other for clarity.

DETAILED DESCRIPTION OF THE PREFERRED EMBODIMENTS

Various aspects of the invention will now be described in detail with reference to the FIGURES. An understanding of the invention can be obtained through the explanation of the fabrication of a single vertical bipolar device as illustrated in FIGS. 1-8; however, it will be understood that an integrated circuit contains many such devices and that both PNP and NPN devices may be present depending on the circuit being implemented. Moreover, BiCMOS integrated circuits contain PMOS and NMOS transistors whose construction is fully compatible with the described fabrication sequence. Further, the devices can be fabricated on a conventional substrate commonly used in semiconductor manufacturing sciences such as a single crystal substrate, either N or P-type, having an overlying epitaxial layer. Additionally, the substrate can have a buried insulating layer between the semiconductor body and the overlying epitaxial layer, or alternatively, the substrate can comprise an insulating body such as sapphire supporting the epitaxial layer.

Shown in FIG. 1, in cross section, is a portion of a P-type semiconductor substrate 10 having already undergone some of the process steps in accordance with one embodiment of the invention. Substrate 10 includes an N-type epitaxial layer 12 overlying a more heavily doped N-type buried layer 14. An active surface region 16 is formed in epitaxial layer 12 between a first and second isolation regions 18 and 20. Isolation regions 18 and 20 provide electrical isolation at the surface of substrate 10 to electrically isolate the device under construction from adjacent devices. Preferably, the isolation regions are formed from a thick silicon oxide layer which is at least partially recessed into the surface of substrate 10. A first conductive layer 22 having an overlying insulation layer 24 overlies active surface region 16 and isolation regions 18 and 20. First conductive layer 22 is preferably selectively doped P-type polysilicon, however, other conductive materials selectively doped to have a P-type conductivity can be used such as a refractory metal, a refractory metal silicide, and the like. The refractory metal can be one of tungsten, titanium, cobalt, molybdenum and tantalum. Insulation layer 24 is preferably silicon oxide deposited by means of CVD deposition using tetraethoxysilane (TEOS). Alternatively, insulation layer 24 can be a thermally grown silicon oxide or an oxide-nitride composite layer or the like. A photoresist pattern 26 overlies insulation layer 24 and is critically aligned to active surface region 16. Photoresist pattern 26 defines the position of the base electrode component of the bipolar transistor under construction relative to the perimeter of active surface area 16.

In accordance with the invention, once photoresist pattern 26 is formed, insulation layer 24 and first conductive layer 22 are anisotropically etched to form a base electrode 28, as illustrated in FIG. 2-a. The anisotropic etching of insulation layer 24 leaves a base insulation cap 25 overlying base electrode 28. Base electrode 28 extends over a first portion 30 of active surface region 16, where an extrinsic base contact will subsequently be formed, and onto isolation region 20. A second portion 32 of active surface region 16 is exposed by an opening 34 in base electrode 28. A third portion 33 of active surface region 16 adjacent to isolation region 18 is also exposed by the etch. The anisotropic etch process is carried out in a reactive-ion-etch (RIE) reactor using a combination of etch gases and reactor conditions that result in more rapid etching of insulation layer 24 and conductive layer 22 in the vertical direction than the horizontal direction. The directionality of the anisotropic RIE process results in the formation a substantially vertical wall surface on base electrode 28. Alternatively, other etching processes such as reactive sputter etching, reactive ion beam etching and the like can be used to form base electrode 28.

The outline of base electrode 28 on active surface region 16 is used as a doping mask for the formation of an intrinsic base region 36 in epitaxial layer 12. Intrinsic base region 36 is self-aligned to base electrode 28 and forms the active base for the bipolar transistor. The alignment of base electrode 28 to active surface region 16 is illustrated in the cabinet view of substrate 10 shown in FIG. 2-b. Intrinsic base region 36 is preferably formed by ion implantation of a P-type dopant, such as boron, into active surface region 16 using base electrode 28 as an implant mask. The ion implantation step establishes a dopant concentration of about $5 \times 10^{17}$ to $5 \times 10^{18}$ atoms per cubic centimeter in intrinsic base region 36. In an alternative doping method, a molecular beam epitaxial process can be used to introduce atoms having P-type conductivity into the unmasked portions of active surface area 16.

In the fabrication of a BiCMOS device, the patterning and etching of first conductive layer 22 to form base electrode 28 also forms transistor gate electrodes for associated NMOS and PMOS transistors. The MOS transistor gate electrodes are formed over a gate oxide layer which is formed overlying epitaxial layer 12, then selectively removed over active surface region 16 prior to deposition of first conductive layer 22. In this and the following discussion the process steps used in fabricating MOS devices will be described but not illustrated in the FIGURES. Following the etch step, resist layer 26 is removed and lightly doped N− and P− source/drain regions are formed in the MOS area by successive photolithographic patterning and ion implantation steps. The photolithographic masks cover the bipolar area during the MOS ion implantation steps.

Figure 3:
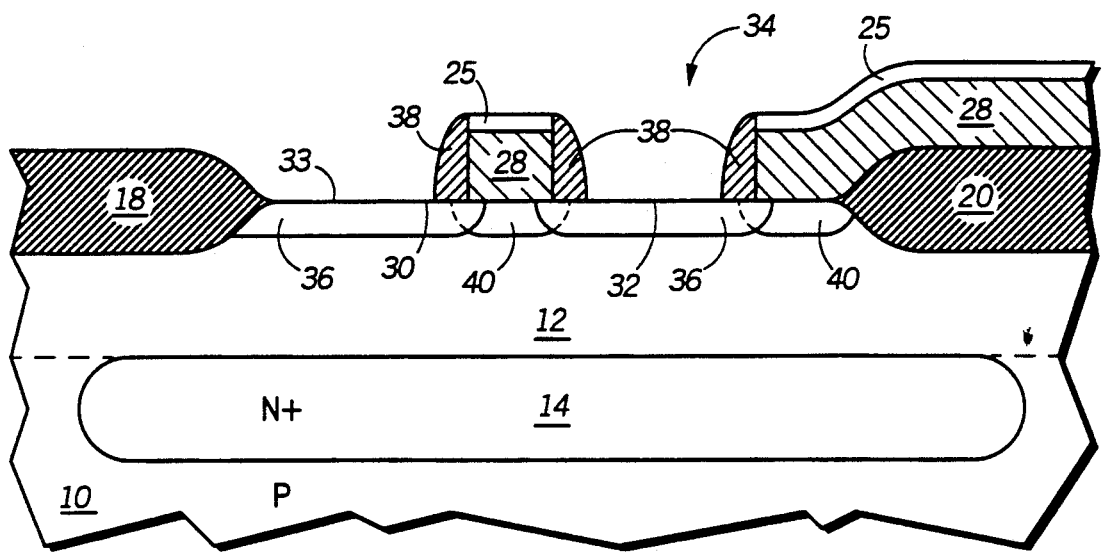
FIGS. 3-7 illustrate, in cross section, further process steps in accordance with the invention for the formation of a vertical bipolar transistor.

The process continues with the formation of a sidewall spacer 38 on the vertical surfaces of base electrode 28 as shown in FIG. 3. Sidewall spacer 38 covers the vertical surface of base electrode 28 extending from insulation cap 25 to active surface region 16 providing the walls of base electrode 28 with electrical insulation and protection from chemical attack. Preferably, sidewall spacer 38 is formed by first oxidizing substrate 10 to form a thin silicon oxide layer on active surface region 16. Next, a layer of spacer forming material is conformably deposited to a thickness of about 200 to 400 nanometers and anisotropically etched using a selective etch process that etches the spacer forming material more rapidly than the underlying silicon oxide. The spacer forming material can be any electrically insulating material which can be conformably deposited and anisotropically etched. In a preferred embodiment, the spacer forming material is silicon nitride, however, other materials such as, CVD deposited silicon oxide, oxynitrides, and the like can also be used. Sidewall spacer 38 and insulation cap 25 effectively encapsulates base electrode 28 with a protective electrically insulating layer. The deposited thickness of the sidewall spacer forming material directly determines the width of sidewall spacer 38 on base electrode 28. As will subsequently become apparent, the width of sidewall spacer 38 will determine the lateral spacing between the emitter and the collector of the bipolar transistor as well as the lateral spacing between the extrinsic base and the emitter. The width of sidewall spacer 38 is also important in determining the current gain ($\beta$) because the spacer width also determines the effective area of the emitter contact.

During the oxidation portion of the sidewall spacer forming process, the P-type dopant atoms present in base electrode 28 diffuse into first portion 30 of active surface region 16 forming an extrinsic base region 40 in epitaxial layer 12. The autodoping process self-aligns extrinsic base region 40 to base electrode 28 and provides a low resistance electrical path between intrinsic base region 36 and base electrode 28. In the formation of a BiCMOS device, successive photo masking and ion implantation steps are carried out to form the heavily doped N+ and P+ source/drain regions for the NMOS and PMOS transistors. The anneal step used to activate the source/drain dopant atoms in the source/drain regions of the MOS devices can be used to diffuse the P-type base dopant atoms from base electrode 28 into extrinsic base region 40. The autodoping process establishes a doping concentration of about $1 \times 10^{19}$ to $1 \times 10^{20}$ atoms per cubic centimeter in extrinsic base region 40.

Figure 4:
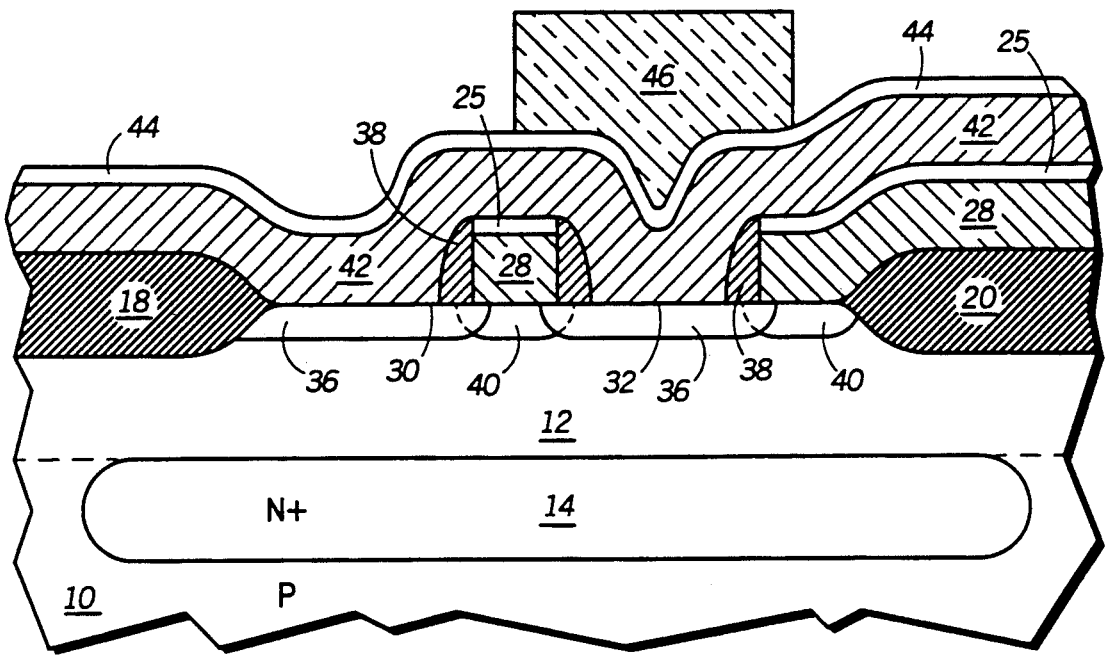

Subsequent to the formation of sidewall spacer 38 a second conductive layer 42 is deposited onto substrate 10 as illustrated in FIG. 4. Following the deposition, second conductive layer 42 is doped with an N-type dopant such as arsenic or phosphorus preferably by ion implantation. Second conductive layer 42 is preferably polysilicon, however other conductive materials can be used such as a refractory metal, or a refractory metal silicide or the like. The refractory metal can be one of tungsten, titanium, cobalt, molybdenum and tantalum. In a manner similar to the formation of base electrode 28; the doping step is followed by the deposition of a second insulation layer 44, preferably comprising silicon oxide, onto second conductive layer 42. Second insulation layer 44 is deposited in, for example, a CVD reactor wherein TEOS is thermal decomposed to form a uniform layer of silicon oxide overlying the features which have been formed on substrate 10. A photoresist pattern 46 is formed overlying second insulation layer 44 which defines a portion of second conductive layer 42 to be used as an emitter electrode.

Figure 5:
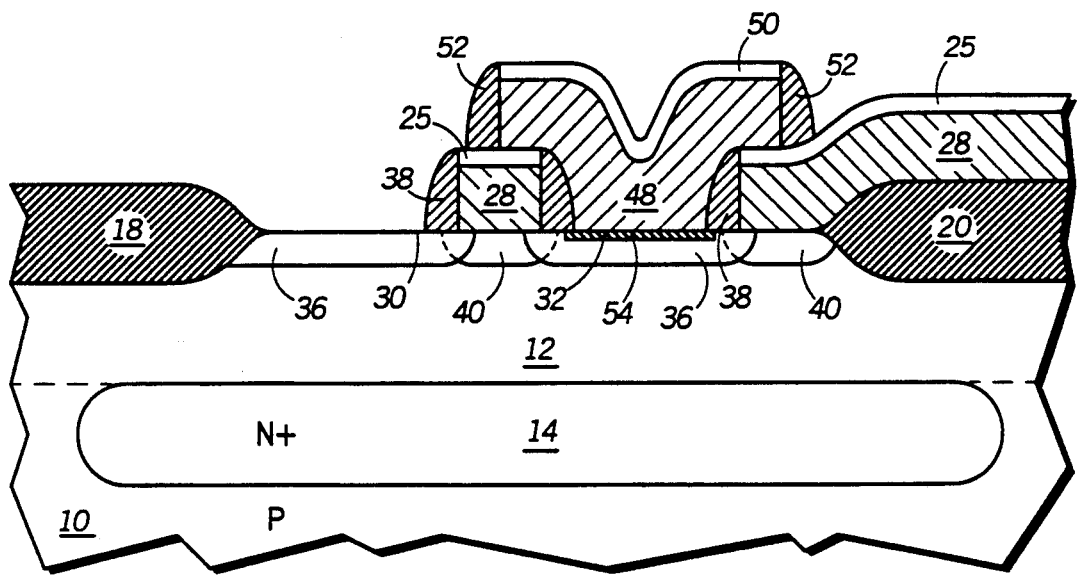

Following the formation of photoresist pattern 46, layers 42 and 44 are anisotropically etched to form an emitter electrode 48 which overlies a portion of base electrode 28 and extends into opening 34 forming an emitter contact with intrinsic base region 36, as shown in FIG. 5. Emitter electrode 48 is electrically isolated from base electrode 28 by base insulation cap 25 and by a portion of sidewall spacer 38. The etching process also leaves an emitter insulation cap 50 overlying emitter electrode 48. The self-aligned process for the formation of the emitter herein described reduces the degree of precision that must be used to align photoresist pattern 46 to active surface region 16. The decrease in degree of necessary alignment precision reduces the process cycle time and increases the process yield of functional transistors.

As shown in FIG. 5, a sidewall spacer 52 is formed on the vertical surfaces of emitter electrode 48 in a manner analogous to that previously described for the formation of sidewall spacer 38 on base electrode 28. Sidewall spacer 52 protects the vertical surface of emitter electrode 48 from chemical attack during the subsequent etching process used to from a collector plug component of the bipolar transistor. During the thermal processing used to form sidewall spacer 52, N-type dopant is diffused out of emitter electrode 48 and into intrinsic base region 36 to form an emitter region 54. The autodoping from emitter 48 into epitaxial layer 12 forms an emitter which is completely self-aligned to base electrode 28. The lateral diffusion of N-type dopant atoms extends the perimeter of emitter region 54 under a portion of sidewall spacer 38; however, the autodoping process is controlled such that emitter region 54 remains spaced apart from base electrode 28, as shown in FIG. 5.

Figure 6:
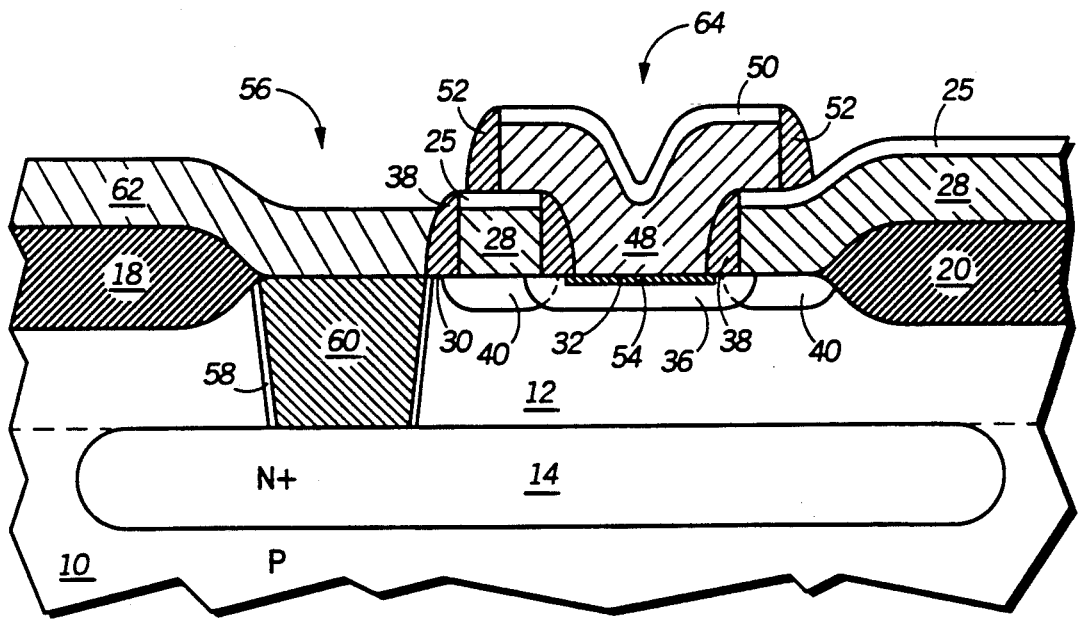

In accordance with the invention, a collector plug 60 is formed extending from portion 33 of active surface region 16 to buried layer 14, as shown in FIG. 6. Collector plug 60 is preferably fabricated by first masking off areas of the substrate not involved in the bipolar circuit construction, such as associated MOS device areas, then, anisotropically etching epitaxial layer 12 to form a trench 56. The selectivity of the anisotropic etch is such that the exposed insulating layers and sidewall spacers are not appreciably etched during the trench formation.

The selectivity of the etch is defined as the etch rate differential between the layer to be etched and the underlying substrate. A portion of buried layer 14 is exposed during the formation of trench 56. Next, a lateral diffusion barrier 58 is optionally formed by preferably growing a thin layer of silicon oxide on the surface of trench 56 and then anisotropically etching the silicon oxide to remove a portion overlying buried layer 14. Alternatively, a diffusion barrier material can be deposited onto the surface of trench 56 and anisotropically etched. The deposited diffusion barrier material can be silicon oxide, silicon nitride, an oxynitride and the like. After etching the silicon oxide layer to expose the surface of buried layer 14, silicon is selectively deposited using the exposed portion of buried layer 14 as a nucleation site. The selectively deposited silicon substantially fills trench 56 to form collector plug 60. In the selective deposition process, the deposition reaction is adjusted so that the polysilicon is deposited only on exposed silicon which acts as a nucleation site for the deposition. The selectively deposited polysilicon initially deposits on the exposed surface of buried layer 14. Once the selective deposition begins on the nucelation site, the selectively deposited polysilicon itself acts as a nucleation site so that the reaction continues depositing successive layers of polysilicon, eventually forming a thick layer substantially filling trench 56. The selectively deposited polysilicon does not otherwise deposit on oxides or other dielectric material. Those skilled in the art will recognize that other conductive materials can be used to form collector plug 60, for example, tungsten can be selectively deposited into trench 56 using the exposed surface of buried layer 14 as a nucleation site.

In an alternative method for the fabrication of collector plug 60, trench 56 and diffusion barrier 58 are formed, then a layer of conductive material is chemical vapor deposited overlying the features on substrate 10 to a thickness sufficient to completely fill trench 56. Following deposition, the conductive material is selectively etched back leaving a portion of the conductive material substantially filling trench 56 and removing substantially all of the conductive material from the remaining areas of substrate 10.

Once collector plug 60 has been formed, a third conductive layer is deposited, photolithographically patterned, and etched to form a collector electrode 62. As illustrated in FIG. 6, collector electrode 62 contacts collector plug 60 at active surface region 16 and is electrically isolated from base electrode 28 by sidewall spacer 38. In an alternate embodiment of the invention, the selective deposition process used to fabricate collector plug 60 is continued such that successive layers of silicon are deposited above the plane active surface area 16 and onto oxide isolation region 18 and sidewall spacer 38. The continuation of the selective deposition process forms the self-aligned collector electrode spaced apart by sidewall spacer 38 from base electrode 28, and by sidewall spacer 52 from emitter electrode 48. The selectively deposition process is continued for a sufficient amount of time to form a body of silicon, above collector plug 60, having a surface area of adequate dimensions to permit contact by an overlying collector lead.

The process steps described above have resulted in the formation of a vertical bipolar transistor 64 comprising: collector plug 60, collector electrode 62, buried layer 14, base electrode 28, base regions 36 and 40, emitter electrode 48, emitter region 54 and epitaxial layer 12. The particular embodiment of the invention described herein and depicted in FIGS. 1-6 illustrates the self-aligned aspect of the electrodes and associated conductive regions in bipolar transistor 64. As will be apparent to one skilled in the art, once base electrode 28 is aligned to active surface region 16, the fabrication of the emitter and collector structures in bipolar transistor 64 is accomplished without the necessity of a critical photolithographic alignment. Both the emitter and the collector are self-aligned to the base of the transistor. Those skilled in the art will recognize that the elimination of the need to carry out a critical photolithographic alignment to form the emitter and collector enables the emitter and collector to be spaced much closer to the base and to each other in the vertical bipolar structure. The self-aligned fabrication process described above permits the formation of bipolar transistors having submicron lateral dimensions absent constraining submicron photolithography requirements.

Figure 7:
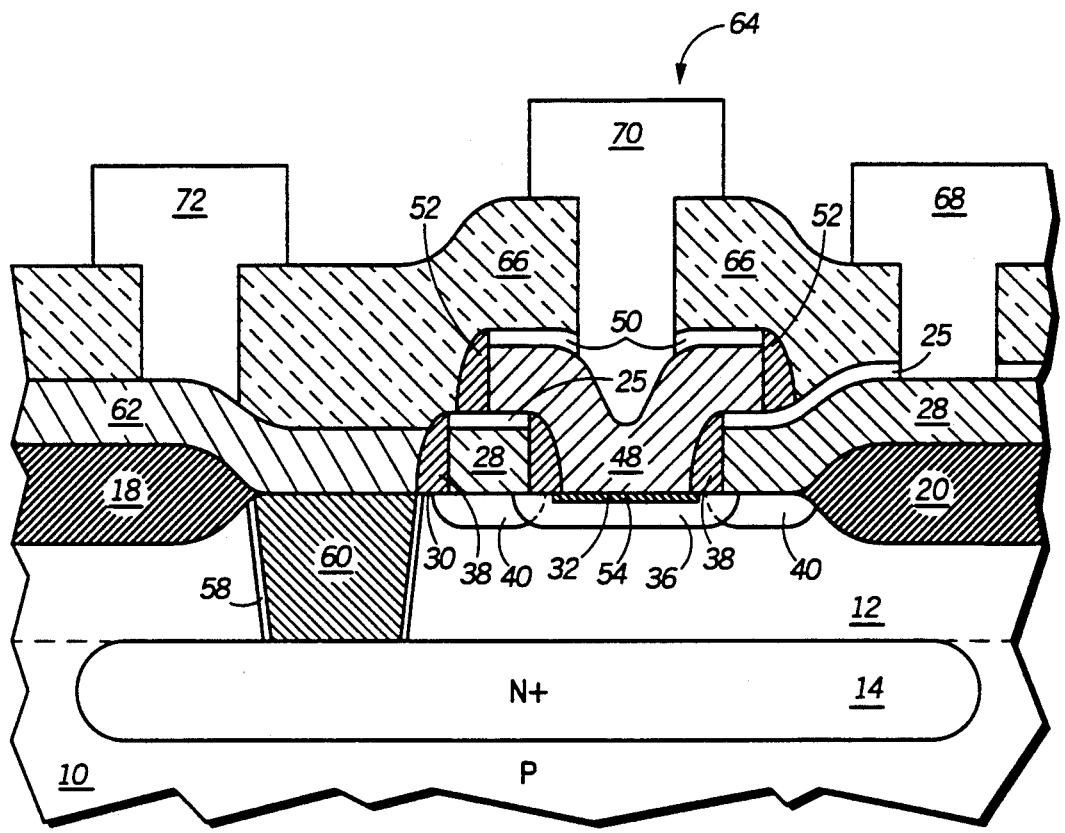

External electrical contact is made to bipolar transistor 64 by first depositing a passivation layer 66, then anisotropically etching contact holes to expose a portion of base electrode 28, emitter electrode 48, and collector electrode 62 as shown in FIG. 7. The etch process also removes a portion of the insulation layers overlying base electrode 28 and emitter electrode 48. Passivation layer 66 is preferably a doped silicon oxide such as borophosphorus silicate glass or phosphorus silicate glass, or the like. Once deposited, the doped glass is annealed at a high temperature to flow the glass over the surface of substrate 10. During the flow process additional dopant is diffused out of emitter electrode 48 and base electrode 28 and into epitaxial layer 12. Alternatively, passivation layer 66 can be a spin on glass or a plasma nitride or other CVD deposited undoped silicate glass. The external electrical contact is completed by the deposition and etching of a layer of conductive material to form a base lead 68, an emitter lead 70 and a collector lead 72. Leads 68, 70 and 72 extend across substrate 10 and electrically connect bipolar transistor 64 with other transistors and peripheral circuit elements. The conductive material used to form the leads can be conductive material such as polysilicon, a refractory metal silicide, aluminum alloyed with silicon and copper, a refractory metal such as tungsten or a tungsten titanium alloy and the like. In the formation of a BiCMOS device, source/drain contacts and leads are also formed for the MOS devices.

Figure 8:
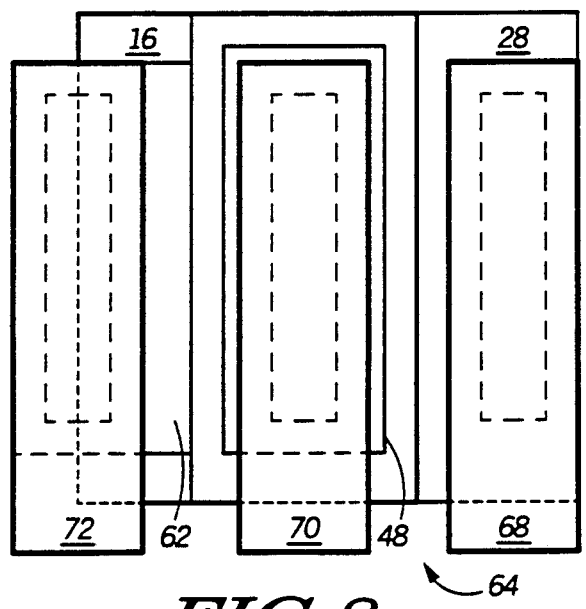
FIG. 8 is a top view of the bipolar transistor structure shown in FIG. 7.

The reduction in lateral dimensions and compact construction obtained by the bipolar transistor of the present invention is illustrated in the top view of transistor 64 shown in FIG. 8. The alignment of base electrode 28 to active surface region 16 defines the relative positions of emitter electrode 48 and collector electrode 62. The position of emitter electrode 48 overlying opening 34 in base electrode 28 is also illustrated. The positioning of collector electrode 62 relative to base electrode 28 is only limited by the width of sidewall spacer 38 (not shown) covering the edge of base electrode 28.

Without further elaboration, it is believed that one skilled in the art can, using the preceding description, utilize the invention to its fullest extent. The following preferred specific embodiment is, therefore, to be construed as merely illustrative, and not limitative of the remainder of the disclosure in any way whatsoever.

BICMOS EXAMPLE

Figure 9:
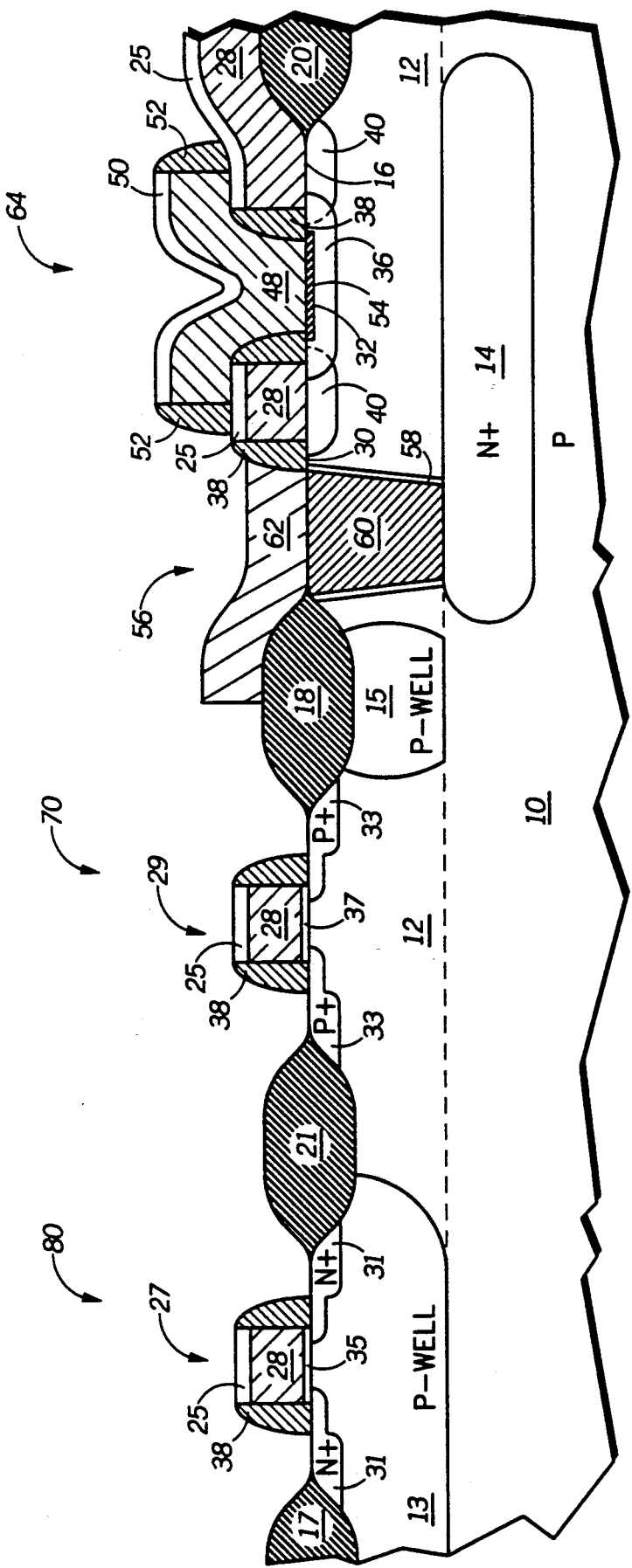
FIG. 9 illustrates, in cross section, a portion of a BiCMOS device fabricated in accordance with the invention.

The integration of bipolar transistor 64 with a PMOS transistor 70 and an NMOS transistor 80 is illustrated in FIG. 9. P-well regions 13 and 15 and isolation regions 17 and 21 are formed in epitaxial layer 12 to partition epitaxial layer 12 into electrically isolated regions supporting transistors of opposite conductivity type. The P-well regions are formed in epitaxial layer 12, prior to the formation of the isolation regions, by photolithographically patterning epitaxial layer 12 then ion implanting boron into exposed portions epitaxial layer 12. An MOS gate dielectric layer is provided by first oxidizing epitaxial layer 12, then covering all portions of substrate 10 except active surface region 16 with photoresist. Once the MOS regions are protected, the oxide overlying active surface region 16 is etched away. The base electrode formation and ion implant processes previously described simultaneously form insulated gate electrodes 27 and 29, gate oxide layers 35 and 37, and LDD structured source and drain regions 31 and 33.

In a manner consistent with the level of skill in the art to which the present invention pertains, further process steps are carried out, in accordance with the present invention, to complete the fabrication of an integrated circuit device. Depending upon the particular configuration and sequence of photomasking layers, the process of the present invention can be used as an integral part of a complete process further employing additional process steps to fabricate a memory device, data processor device, a digital signal processing device, a logic device and the like.

Thus it is apparent that there has been provided, in accordance with the invention, a bipolar transistor structure and process which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, a PNP transistor can be formed by interchanging the conductivity of the doped regions. Furthermore, in some applications the substrate may be doped to have the same conductivity as the buried layer, such as in the fabrication of a complementary bipolar-CMOS device having both NPN and PNP transistors on the same substrate. It is therefore intended to include within the invention all such variations and modifications as fall within the scope of the appended claims and equivalents thereof.

We claim:

1. A method for fabricating a semiconductor device comprising:
    providing a monocrystalline semiconductor substrate of a first conductivity type having a heavily doped buried layer of a second conductivity type in the substrate extending from a first surface and a lightly doped epitaxial layer of the second conductivity type overlying the first surface;
    forming an isolation region in the epitaxial layer dividing the epitaxial layer into an active region and an isolation region;
    forming a base electrode overlying a first portion of the active region having an opening exposing a second portion of the active region;
    forming a sidewall spacer on the base electrode;
    forming an emitter electrode self-aligned to the base electrode extending through the opening in the base electrode and making contact with the second portion of the active region; and
    anisotropically etching the epitaxial layer using the sidewall spacer on the base electrode and the isolation region as an etch mask to form a collector plug self-aligned to the active region, the collector plug extending through the epitaxial layer making electrical contact with the buried layer.

2. The method of claim 1 wherein the step of forming an emitter electrode further comprises:
    forming an insulation layer overlying the emitter electrode; and
    forming sidewall spacers on the emitter electrode.

3. The method of claim 1 wherein the step of forming a collector plug further comprises:
    anisotropically etching the epitaxial layer to form a trench in the epitaxial layer having exposing a portion of the buried layer;
    forming a diffusion barrier layer on the surface of the trench;
    anisotropically etching the diffusion barrier layer to remove a portion overlying the buried layer; and
    selectively depositing silicon to substantially fill the trench using the exposed portion of the buried layer as a nucleation material.

4. The method of claim 1 further comprising the steps of:
    introducing dopant atoms of the first conductivity type into the epitaxial layer using the base electrode as a doping mask to form an intrinsic base region;
    diffusing dopant atoms of the first conductivity type from the base electrode overlying the first portion of the active region to form an extrinsic base region extending into the epitaxial layer; and
    diffusing dopant atoms of the second conductivity type from the emitter electrode overlying the second portion of the active region to form an emitter region and extending into the intrinsic base region.

5. A method for fabricating a semiconductor device having the emitter and the collector self-aligned to the base comprising:
    providing a monocrystalline semiconductor substrate of a first conductivity type having a heavily doped buried layer of a second conductivity type in the substrate extending from a first surface and a lightly doped epitaxial layer of the second conductivity type overlying the first surface;
    forming an isolation region in the epitaxial layer dividing the epitaxial layer into an active region and an isolation region;
    forming a base electrode overlying a first portion of the active surface region and extending onto the isolation region, the base electrode having an opening therein exposing a second portion of the active surface region;
    forming an insulation layer and sidewall spacers on the base electrode;
    forming an emitter electrode having an overlying insulation layer thereon extending into the opening in the base electrode and making contact with the second portion of the active surface region;
    anisotropically etching the epitaxial layer using the sidewall spacer on the base electrode and the isolation region as an etch mask to form a collector plug of the second conductivity type self-aligned to a third portion of the active region located between the isolation region and the sidewall spacer overlying the extrinsic portion of the base electrode, the collector plug extending through the epitaxial layer and making contact with the buried layer; and forming a collector electrode overlying the third portion of the active surface region and making contact with the collector plug.

6. The method of claim 5 wherein the step of forming the base electrode comprises:

depositing a conductive layer overlying the active surface region and the isolation region;

depositing an insulating layer overlying the conductive layer to form a composite layer;

photolithographically patterning the composite layer wherein the photolithographic pattern is aligned to the active surface region; and anisotropically etching the composite layer.

7. The method of claim 5 wherein the step of forming a collector plug further comprises:

anisotropically etching the epitaxial layer to form a trench in the epitaxial layer exposing a portion of the buried layer;

forming a diffusion barrier layer on the surface of the trench;

anisotropically etching the diffusion barrier layer to remove a portion overlying the buried layer; and selectively depositing silicon substantially fill the trench using the exposed portion of the buried layer as a nucleation site.

8. The method of claim 5 wherein the step of forming a collector plug further comprises:

anisotropically etching the epitaxial layer to form a trench in the epitaxial layer exposing a portion of the buried layer;

forming a diffusion barrier layer on the surface of the trench;

chemical vapor depositing a layer of conductive material overlying the active surface region to a sufficient thickness to substantially fill the trench; and etching back the conductive layer to remove substantially all of the same overlying the active surface region.

9. The method of claim 5 further comprising the steps of:

introducing dopant atoms of the first conductivity type into the epitaxial layer using the base electrode as a doping mask to form an intrinsic base region;

diffusing dopant atoms of the first conductivity type from the base electrode overlying the first portion of the active region to form an extrinsic base region extending into the epitaxial layer; and diffusing dopant atoms of the second conductivity type from the emitter electrode overlying the second portion of the active region to form an emitter region and extending into the intrinsic base region.

* * * * *